US012550431B2

(12) United States Patent
Wang et al.

(10) Patent No.: US 12,550,431 B2
(45) Date of Patent: Feb. 10, 2026

(54) ARRAY SUBSTRATES AND DISPLAY PANELS

(71) Applicant: Guangzhou China Star Optoelectronics Semiconductor Display Technology Co., LTd., Guangdong (CN)

(72) Inventors: Qiang Wang, Guangdong (CN); Jiahui Huang, Guangdong (CN)

(73) Assignee: Guangzhou China Star Optoelectronics Semiconductor Display Technology Co., LTd., Guangdong (CN)

( * ) Notice: Subject to any disclaimer, the term of this patent is extended or adjusted under 35 U.S.C. 154(b) by 386 days.

(21) Appl. No.: 18/255,087

(22) PCT Filed: Apr. 18, 2023

(86) PCT No.: PCT/CN2023/088923
§ 371 (c)(1),
(2) Date: May 30, 2023

(87) PCT Pub. No.: WO2024/198000
PCT Pub. Date: Oct. 3, 2024

(65) Prior Publication Data
US 2024/0363650 A1 Oct. 31, 2024

(30) Foreign Application Priority Data
Mar. 30, 2023 (CN) .......................... 202310334773.2

(51) Int. Cl.
*H10D 86/40* (2025.01)
*H10D 30/67* (2025.01)

(52) U.S. Cl.
CPC ....... *H10D 86/423* (2025.01); *H10D 30/6723* (2025.01); *H10D 30/6732* (2025.01); *H10D 30/6755* (2025.01); *H10D 86/441* (2025.01)

(58) Field of Classification Search
CPC .......... H10D 30/6732; H10D 30/6723; H10D 30/6755; H10D 86/423; H10D 86/441
See application file for complete search history.

(56) References Cited

U.S. PATENT DOCUMENTS

2013/0256655 A1*  10/2013  Wang ................. H10D 30/6755
                                               257/43
2021/0020755 A1*  1/2021  Yan .................... H10D 30/6723
(Continued)

FOREIGN PATENT DOCUMENTS

CN  203133439 U  8/2013
CN  206618932 U  11/2017
(Continued)

OTHER PUBLICATIONS

International Search Report in International application No. PCT/CN2023/088923, mailed on Jun. 14, 2023.
(Continued)

*Primary Examiner* — Peter M Albrecht
(74) *Attorney, Agent, or Firm* — PV IP PC; Peter Stecher; Wei Te Chung

(57) ABSTRACT

An array substrate includes a base substrate, an active layer, a first electrode layer, a first insulating layer, and a second electrode layer sequentially disposed, and a sum of an orthographic projection of the first electrode layer on the base substrate and an orthographic projection of the second electrode layer on the base substrate covers an orthographic projection of the active layer on the base substrate.

16 Claims, 5 Drawing Sheets

(56) References Cited

U.S. PATENT DOCUMENTS

2021/0225962 A1 7/2021 Wang et al.
2021/0376031 A1 12/2021 Song et al.
2023/0163141 A1* 5/2023 Li .................... H10D 86/441
                                                                257/72

FOREIGN PATENT DOCUMENTS

| CN | 108767016 A | 11/2018 |
| CN | 115831976 A | 3/2023 |
| JP | H1020298 A | 1/1998 |
| JP | 2002016259 A | 1/2002 |
| JP | 2003115593 A | 4/2003 |
| JP | 2007115902 A | 5/2007 |
| JP | 2018036465 A | 3/2018 |
| JP | 2022159307 A | 10/2022 |

OTHER PUBLICATIONS

Written Opinion of the International Search Authority in International application No. PCT/CN2023/088923, mailed on Jun. 14, 2023.
Japanese Office Action issued in corresponding Japanese Patent Application No. 特願 2023-573486 dated Jun. 17, 2025, pp. 1-10.

* cited by examiner

ARRAY SUBSTRATES AND DISPLAY PANELS

CROSS REFERENCE TO RELATED APPLICATIONS

This application is a National Phase of PCT Patent Application No. PCT/CN2023/088923 having international filing date of Apr. 18, 2023, which claims priority to and the benefit of Chinese Patent Application No. 202310334773.2 filed on Mar. 30, 2023. The contents of the above applications are all incorporated by reference as if fully set forth herein in their entirety.

TECHNICAL FIELD

The present disclosure relates to a field of display technology, and more particularly, to array substrates and display panels.

BACKGROUND

With the development of display technology, more and more attention has been paid to stability of active layers in array substrates. Metal oxide thin film transistors (MO-TFTs), in particular indium gallium zinc oxide (IGZO) TFTs, are widely used in the flat panel display industry due to their good uniformity, high mobility, low leakage current, and suitability for large-area industrial production. However, in the current manufacturing process of the array substrate, the IGZO is prone to be affected by external light, which makes the active layer unstable, resulting in unstable operation performance of the array substrate in an environment in the presence of external light.

SUMMARY

Technical Problem

An embodiment of the present disclosure provides an array substrate and a display panel, which may solve a problem of poor stability of an existing array substrate in an environment in the presence of external light.

Technical Solution

An embodiment of the present disclosure provides an array substrate including:
a base substrate;
an active layer disposed above the base substrate;
a first electrode layer disposed at a side of the active layer away from the base substrate, the first electrode layer is partially overlapped with and jointed to the active layer;
a first insulating layer disposed at a side of the first electrode layer away from the active layer; and
a second electrode layer disposed at a side of the first insulating layer away from the first electrode layer, an orthographic projection of the second electrode layer on the base substrate at least partially covers an orthographic projection of the active layer on the base substrate, and a sum of the orthographic projection of the first electrode layer on the base substrate and the orthographic projection of the second electrode layer on the base substrate covers the orthographic projection of the active layer on the base substrate.

Alternatively, in some embodiments of the present disclosure, the orthographic projection of the second electrode layer on the base substrate covers the orthographic projection of the active layer on the base substrate.

Alternatively, in some embodiments of the present disclosure, a sum of an area of a light shielding region of the second electrode layer to the active layer and an area of a light shielding region of the first electrode layer to the active layer is equal to an area of the orthographic projection of the active layer on the base substrate.

Alternatively, in some embodiments of the present disclosure, the first electrode layer includes a first electrode, and the first electrode is overlapped with and jointed to one end of the active layer; the first insulating layer is provided with a first opening, and the first opening exposes another end of the active layer; and the second electrode layer includes a second electrode, and the second electrode is overlapped with and jointed to the another end of the active layer through the first opening.

Alternatively, in some embodiments of the present disclosure, the first electrode is a drain and the second electrode is a source.

Alternatively, in some embodiments of the present disclosure, the first electrode is the source and the second electrode is the drain.

Alternatively, in some embodiments of the present disclosure, the first electrode layer includes a source and a drain that are overlapped with and jointed to the active layer, the second electrode layer includes a light shielding electrode, and an orthographic projection of the light shielding electrode on the base substrate covers the orthographic projection of the active layer on the base substrate.

Alternatively, in some embodiments of the present disclosure, the array substrate further includes:
a gate layer disposed between the base substrate and the active layer, the gate layer includes a gate disposed corresponding to the active layer, an orthographic projection of the gate on the base substrate covers the orthographic projection of the active layer on the base substrate;
a second insulating layer disposed between the gate layer and the active layer, and covering the gate layer.

Alternatively, in some embodiments of the present disclosure, the array substrate further includes:
a third insulating layer disposed at a side of the second electrode layer away from the first insulating layer, the third insulating layer is provided with a second opening, the second opening penetrates through the third insulating layer and the first insulating layer in a thickness direction of the array substrate, and the second opening exposes the first electrode; and
a pixel electrode layer disposed at a side of the third insulating layer away from the second electrode layer, the pixel electrode layer includes a pixel electrode, and the pixel electrode is electrically connected to the first electrode through the second opening.

Alternatively, in some embodiments of the present disclosure, the array substrate further includes:
a third insulating layer disposed at a side of the second electrode layer away from the first insulating layer, the third insulating layer is provided with a third opening, and the third opening exposes the second electrode; and
a pixel electrode layer disposed at a side of the third insulating layer away from the second electrode layer, the pixel electrode layer includes a pixel electrode, and the pixel electrode is electrically connected to the second electrode through the third opening.

Alternatively, in some embodiments of the present disclosure, the second electrode layer further includes a common electrode, the pixel electrode layer further includes a connecting electrode, the third insulating layer is provided with a fourth opening at a position corresponding to the common electrode, and the connecting electrode is electrically connected to the common electrode through the fourth opening.

Alternatively, in some embodiments of the present disclosure, the second electrode layer further includes a common electrode, the pixel electrode layer further includes a connecting electrode, the third insulating layer is provided with a fourth opening at a position corresponding to the common electrode, and the connecting electrode is electrically connected to the common electrode through the fourth opening.

Alternatively, in some embodiments of the present disclosure, the material of the second electrode layer is an opaque conductive material.

Accordingly, an embodiment of the present disclosure further provides a display panel including the array substrate described in any one of the above.

Accordingly, an embodiment of the present disclosure further provides an array substrate including:
a base substrate;
an active layer disposed above the base substrate;
a first electrode layer disposed at a side of the active layer away from the base substrate, the first electrode layer is partially overlapped with and jointed to the active layer;
a first insulating layer disposed at a side of the first electrode layer away from the active layer; and
a second electrode layer disposed at a side of the first insulating layer away from the first electrode layer, an orthographic projection of the second electrode layer on the base substrate covers an orthographic projection of the active layer on the base substrate
the first electrode layer includes a first electrode, and the first electrode is overlapped with and jointed to one end of the active layer; the first insulating layer is provided with a first opening, and the first opening exposes another end of the active layer; and the second electrode layer includes a second electrode, and the second electrode is overlapped with and jointed to the another end of the active layer through the first opening.

Alternatively, in some embodiments of the present disclosure, the first electrode is a drain and the second electrode is a source.

Alternatively, in some embodiments of the present disclosure, the first electrode is the source and the second electrode is the drain.

Alternatively, in some embodiments of the present disclosure, the array substrate further includes:
a gate layer disposed between the base substrate and the active layer, the gate layer includes a gate disposed corresponding to the active layer, and an orthographic projection of the gate on the base substrate covers the orthographic projection of the active layer on the base substrate; and
a second insulating layer disposed between the gate layer and the active layer, the second insulating layer covers the gate layer.

Alternatively, in some embodiments of the present disclosure, the array substrate further includes:
a third insulating layer disposed at a side of the second electrode layer away from the first insulating layer, the third insulating layer is provided with a second opening, the second opening penetrates through the third insulating layer and the first insulating layer in a thickness direction of the array substrate, and the second opening exposes the first electrode; and
a pixel electrode layer disposed at a side of the third insulating layer away from the second electrode layer, the pixel electrode layer includes a pixel electrode, and the pixel electrode is electrically connected to the first electrode through the second opening.

Alternatively, in some embodiments of the present disclosure, the array substrate further includes:
a third insulating layer disposed at a side of the second electrode layer away from the first insulating layer, the third insulating layer is provided with a third opening, and the third opening exposes the second electrode; and
a pixel electrode layer disposed at a side of the third insulating layer away from the second electrode layer, the pixel electrode layer includes a pixel electrode, and the pixel electrode is electrically connected to the second electrode through the third opening.

Beneficial Effect

An array substrate in an embodiment of the present disclosure includes a substrate, an active layer, a first electrode layer, a first insulating layer, and a second electrode layer. The active layer is disposed above the substrate, the first electrode layer is disposed at a side of the active layer away from the substrate, the first electrode layer is partially overlapped with and jointed to the active layer, the first insulating layer is disposed at a side of the first electrode layer away from the active layer, the second electrode layer is disposed at a side of the first insulating layer away from the first electrode layer, an orthographic projection of the second electrode layer on the base substrate at least partially covers an orthographic projection of the active layer on the base substrate, and a sum of the orthographic projections of the first electrode layer and the second electrode layer on the base substrate covers the orthographic projection of the active layer on the base substrate. According to the present disclosure, the sum of the orthographic projections of the first electrode layer and the second electrode layer on the base substrate is set to cover the orthographic projections of the active layer on the base substrate, so that the first electrode layer and the second electrode layer may jointly play a protective role on the active layer, and the influence of the external light on the active layer is avoided, thereby ensuring the stability of the array substrate.

BRIEF DESCRIPTION OF THE DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION

Figure 1:
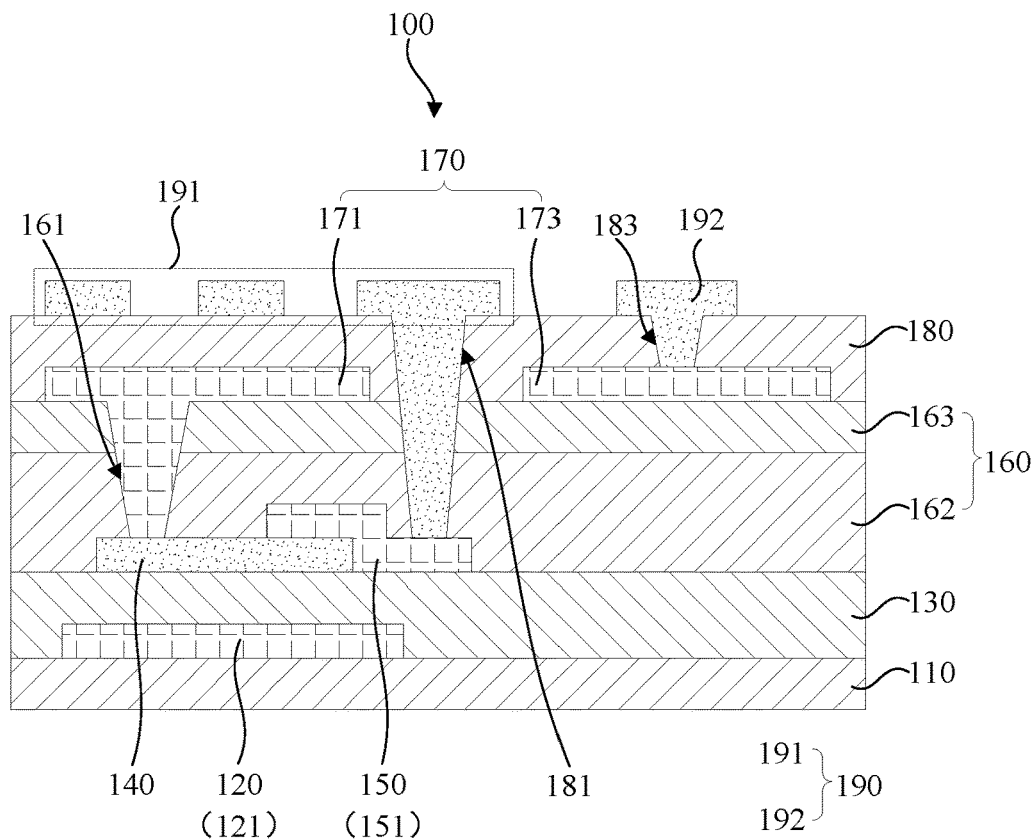
FIG. 1 is a schematic structural diagram of an array substrate according to an embodiment of the present disclosure.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure. In addition, it should be understood that the specific implementations described here are only used to illustrate and explain the present disclosure, and are not used to limit the present disclosure. In the present disclosure, unless otherwise stated, directional words used such as "upper" and "lower" generally refer to the upper and lower directions of the device in actual use or working state, and specifically refer to the drawing directions in the drawings; and "inner" and "outer" refer to the outline of the device.

Embodiments of the present disclosure provide an array substrate, a display panel, and a method for manufacturing the array substrate, and will be described in detail below. It should be noted that the order in which the following embodiments are described is not intended to limit the preferred order of the embodiments.

Figure 2:
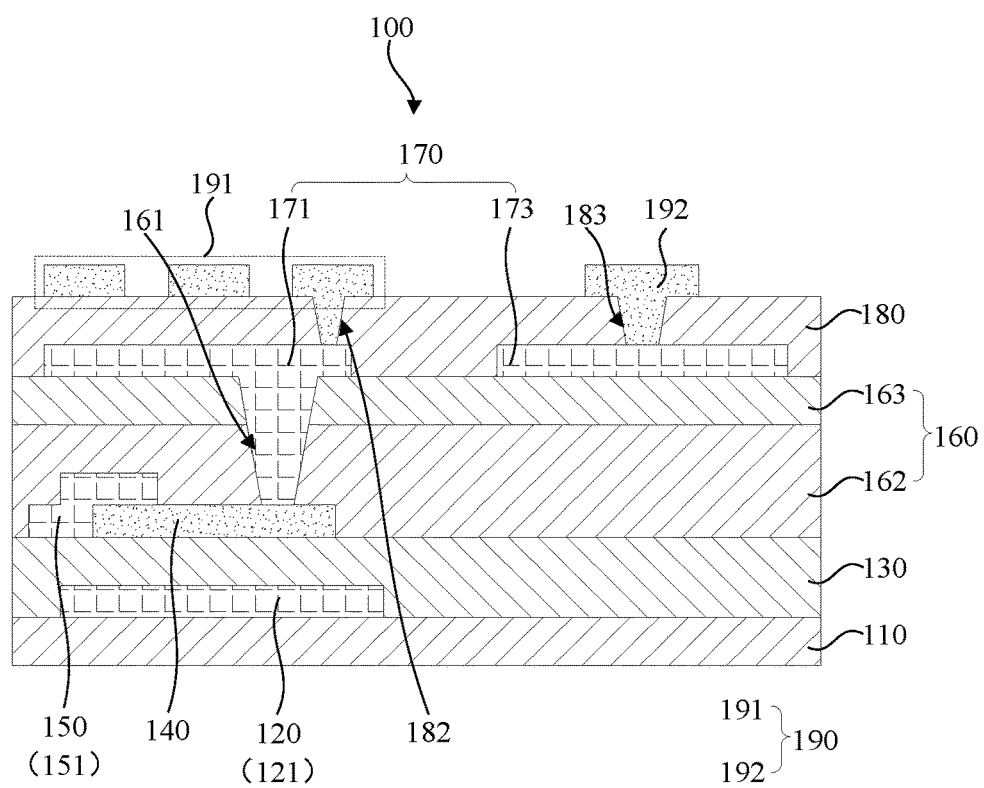
FIG. 2 is a schematic structural diagram of another array substrate according to an embodiment of the present disclosure.
Figure 3:
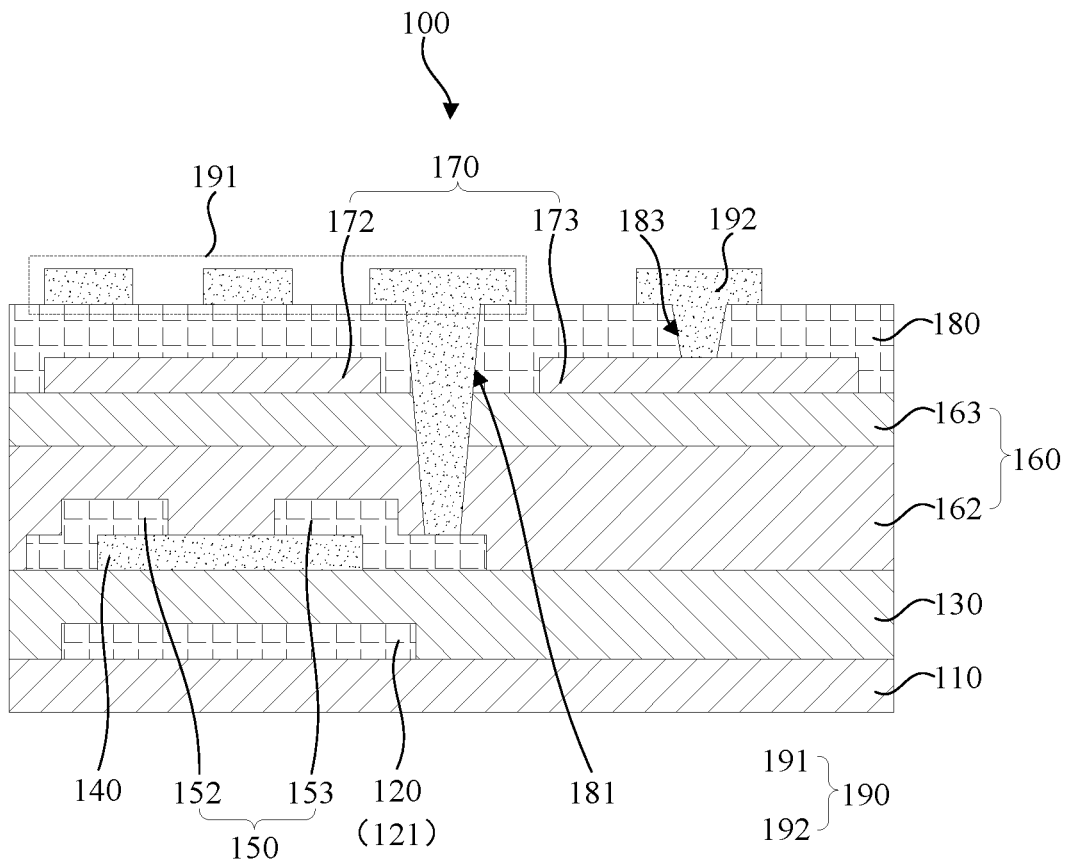
FIG. 3 is a schematic structural diagram of another array substrate according to an embodiment of the present disclosure.

First, an embodiment of the present disclosure provides an array substrate. As shown in FIGS. 1 to 3, an array substrate 100 includes a base substrate 110, which serves as a support structure for the array substrate 100 and is used to support other functional structure layers of the array substrate 100 to ensure structural stability of the array substrate 100. The base substrate 110 may be a glass substrate or a substrate including other materials, and is not particularly limited herein.

The array substrate 100 includes an active layer 140 disposed on the base substrate 110. The active layer 140 is used as an important component of the thin film transistor to form a conductive channel. The on-state of the thin film transistor may be controlled by regulating the conductive channel in the active layer 140.

The array substrate 100 includes a first electrode layer 150 disposed at a side of the active layer 140 away from the base substrate 110, and the first electrode layer 150 is partially overlapped with and jointed to the active layer 140. By providing the first electrode layer 150 to be partially overlapped with and jointed to the active layer 140, an input signal on the array substrate 100 may be transmitted between the active layer 140 and the first electrode layer 150, thereby achieving normal use of the array substrate 100.

The array substrate 100 includes a first insulating layer 160 disposed at a side of the first electrode layer 150 away from the active layer 140 so as to separate the first electrode layer 150 from a subsequent functional layer, thereby preventing the first electrode layer 150 from being directly overlapped with and jointed to the subsequent functional layer to cause mutual interference and further affect the normal use of the array substrate 100.

The first insulating layer 160 includes a passivation layer 162 and a planarization layer 163 which are arranged in a stacked manner. The passivation layer 162 mainly plays the role of insulation. When the first electrode layer 150 is formed, the first electrode layer 150 needs to be patterned, and thus the surface flatness is poor after the formation of the passivation layer 162. By forming the planarization layer 163 on the passivation layer 162, it is conducive to improving the flatness of the overall surface, thereby contributing to the fabrication of subsequent film layers, and ensuring the overall structural stability of the array substrate 100.

The array substrate 100 further includes a second electrode layer 170 disposed at a side of the first insulating layer 160 away from the first electrode layer 150, and an orthographic projection of the second electrode layer 170 on the base substrate 110 at least partially covers an orthographic projection of the active layer 140 on the base substrate 110. The sum of the orthographic projections of the first electrode layer 150 and the second electrode layer 170 on the base substrate 110 covers the orthographic projection of the active layer 140 on the base substrate 110. That is, the first electrode layer 150 partially covers the active layer 140 when overlapped with and jointed to the active layer 140, the orthographic projection of the second electrode layer 170 on the base substrate 110 is provided to at least partially cover the orthographic projection of the active layer 140 on the base substrate 110, and the sum of the orthographic projections of the first electrode layer 150 and the second electrode layer 170 on the base substrate 110 is provided to cover the orthographic projection of the active layer 140 on the base substrate 110, thereby enabling the first electrode layer 150 and the second electrode layer 170 to protect the active layer 140, avoiding the influence of ambient light on the active layer 140, and further ensuring the stability of the array substrate 100.

In an embodiment of the present disclosure, the array substrate 100 includes the base substrate 110, the active layer 140, the first electrode layer 150, the first insulating layer 160, and the second electrode layer 170, which are arranged in sequence. The first electrode layer 150 is partially overlapped with and jointed to the active layer 140. The orthographic projection of the second electrode layer 170 on the base substrate 110 at least partially covers the orthographic projection of the active layer 140 on the base substrate 110. The sum of the orthographic projections of the first electrode layer 150 and the second electrode layer 170 on the base substrate 110 covers the orthographic projection of the active layer 140 on the base substrate 110. In the present disclosure, the orthographic projection of the second electrode layer 170 on the base substrate 110 is provided to at least partially cover the orthographic projection of the active layer 140 on the base substrate 110, and the sum of the orthographic projections of the first electrode layer 150 and the second electrode layer 170 on the base substrate 110 is provided to cover the orthographic projection of the active layer 140 on the base substrate 110, so that the first electrode layer 150 and the second electrode layer 170 may jointly protect the active layer 140, thereby avoiding the influence of external light on the active layer 140, and further ensuring stability of the array substrate 100.

Alternatively, the orthographic projection of the second electrode layer 170 on the base substrate 110 covers the orthographic projection of the active layer 140 on the base substrate 110. That is, when the second electrode layer 170 is formed and patterned, the orthographic projection of a portion of the second electrode layer 170 corresponding to the active layer 140 on the base substrate 110 may directly cover the orthographic projection of the active layer 140 on the base substrate 110, so that the second electrode layer 170 itself may realize light shielding effect on the active layer 140 regardless of the area of the light shielding region of the first electrode layer 150 to the active layer 140, thereby contributing to the simplification of the patterned design of the second electrode layer 170.

Figure 10:
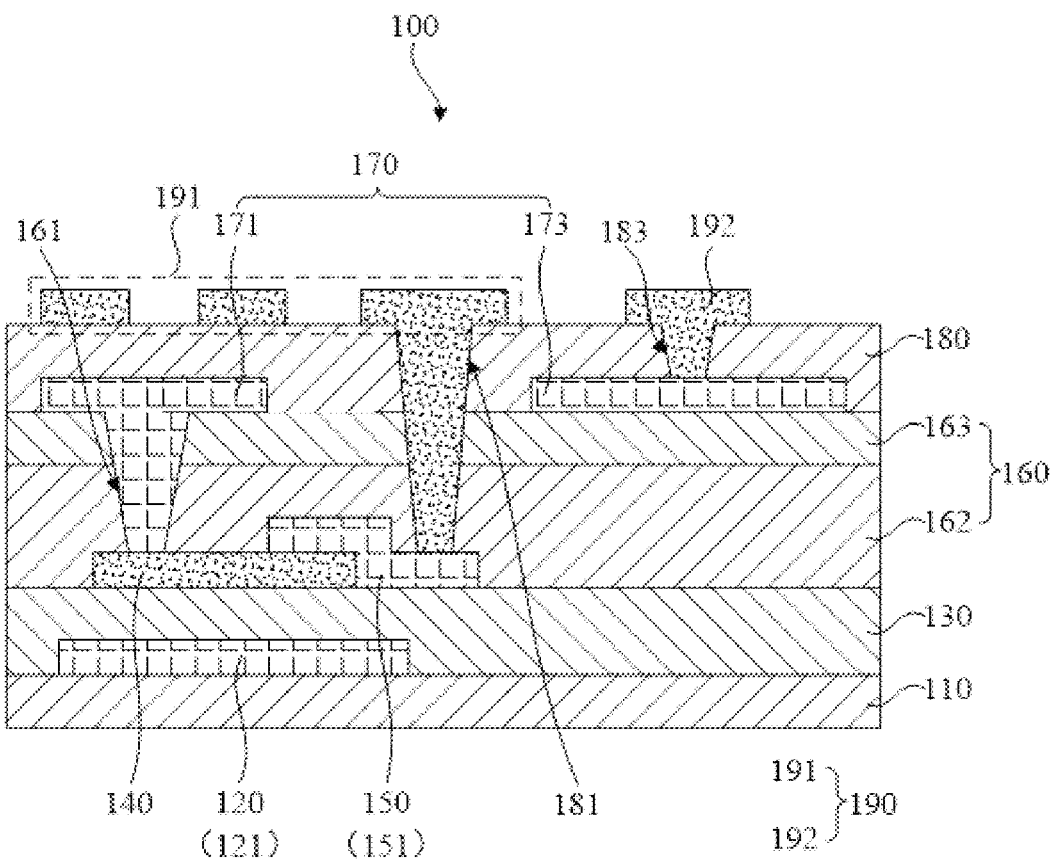
FIG. 10 is a schematic structural diagram of an array substrate according to some embodiments of the present disclosure.

It should be noted that in other embodiments, as shown in FIG. 10, when the second electrode layer 170 is formed and patterned, the area of the active layer 140 and the area of the light shielding region of the first electrode layer 150 to the active layer 140 may be considered at the same time, so that the orthographic projection of the portion of the second electrode layer 170 corresponding to the active layer 140 on the base substrate 110 covers only the portion of the active layer 140 not shielded by the first electrode layer 150. That is, the area of the light shielding region of the second electrode layer 170 to the active layer 140 and the area of the light shielding region of the first electrode layer 150 are equal to the area of the orthographic projection of the active layer 140 on the base substrate 110, thereby maximizing the utilization of the light shielding effect of the first electrode layer 150 and the second electrode layer 170, saving the use of the second electrode layer 170, reducing the overall weight of the array substrate 100, and realizing the lightweight design of the array substrate 100.

The specific design of the second electrode layer 170 may be adjusted according to actual design requirements, and it is only necessary to ensure that the first electrode layer 150 and the second electrode layer 170 may be arranged to achieve the light shielding effect on the active layer 140, so as to avoid the influence of the external light on the active layer 140, thereby ensuring the stability of the array substrate 100. There are no special limitations herein.

In some embodiments, as shown in FIG. 1, the first electrode layer 150 includes a first electrode 151 that is overlapped with and jointed to one end of the active layer 140, a first opening 161 is formed in the first insulating layer 160, the first opening 161 exposes the other end of the active layer 140, and the second electrode layer 170 includes a second electrode 171 that is overlapped with and jointed to the other end of the active layer 140 through the first opening 161. That is, the first electrode 151 and the second electrode 171 are parts of the thin film transistor, and the first electrode 151 and the second electrode 171 are respectively overlapped with and jointed to both ends of the active layer 140, so that carriers flow between the first electrode 151 and the second electrode 171 through the conductive channel in the active layer 140, thereby achieving normal use of the array substrate 100. At the same time, the second electrode 171 may also serve as a light shielding effect on the active layer 140, so as to avoid the influence of the external light on the active layer 140, thereby ensuring the stability of the array substrate 100.

The first electrode 151 is a drain, the second electrode 171 is a source, or the first electrode 151 is a source, and the second electrode 171 is a drain. The definition of the source and drain may be adjusted according to actual design requirements, and is not particularly limited herein. The turn-on or turn-off of the thin film transistor may be controlled by controlling the conduction or disconnection between the source and the drain.

In other embodiments, as shown in FIG. 3, the first electrode layer 150 includes a source 152 and a drain 153 that are overlapped with and jointed to the active layer 140, the second electrode layer 170 includes a light shielding electrode 172, and an orthographic projection of the light shielding electrode 172 on the base substrate 110 covers the orthographic projection of the active layer 140 on the base substrate 110. That is, the first electrode layer 150 forms the source 152 and the drain 153 of the thin film transistor at the same time, and a portion of the second electrode layer 170 corresponding to the active layer 140 only serves as a light shielding function, so as to avoid the influence of the external light on the active layer 140, thereby ensuring the stability of the array substrate 100. This configuration makes the use of the thin film transistor independent of the light shielding electrode 172, so as to prevent the light shielding electrode 172 from interfering with the use of the thin film transistor, thereby ensuring stability during use of the array substrate 100.

It should be noted that the material of the second electrode layer 170 is an opaque conductive material, so as to simultaneously satisfy the light shielding effect of the second electrode layer 170 on the active layer 140 and the purpose of overlapping and jointing between the corresponding second electrode 171 and the active layer 140 in the embodiments shown in FIGS. 1 and 2, thereby realizing the transmission of the control signal in the array substrate 100.

Alternatively, the array substrate 100 further includes a gate layer 120 disposed between the base substrate 110 and the active layer 140, the gate layer 120 includes a gate 121 disposed corresponding to the active layer 140, and an orthographic projection of the gate 121 on the base substrate 110 covers the orthographic projection of the active layer 140 on the base substrate 110. The gate 121 is a part of the thin film transistor. When a control signal is input to the gate 121, the active layer 140 may generate an induced charge and forms a conductive channel, thereby realizing conduction between the source and the drain in the thin film transistor. By making the orthographic projection of the gate 121 on the base substrate 110 to cover the orthographic projection of the active layer 140 on the base substrate 110, the gate 121 may shield a side of the active layer 140 facing the base substrate 110 at the same time, thereby realizing the double-side light shielding of the active layer 140, further avoiding the influence of external light on the active layer 140, and ensuring the stability of the array substrate 100.

The array substrate 100 further includes a second insulating layer 130 disposed between the gate layer 120 and the active layer 140, and the second insulating layer 130 covers the gate layer 120 to separate the gate layer 120 from the active layer 140, avoiding interference between the gate layer 120 and the active layer 140, thereby ensuring normal operation of the thin film transistor.

Alternatively, the array substrate 100 further includes a third insulating layer 180 and a pixel electrode layer 190, the third insulating layer 180 is disposed at a side of the second electrode layer 170 away from the first insulating layer 160, and the pixel electrode layer 190 is disposed at a side of the third insulating layer 180 away from the second electrode layer 170. The third insulating layer 180 serves to separate the second electrode layer 170 from the pixel electrode layer 190 so as to avoid mutual interference between the pixel electrode layer 190 and the second electrode layer 170, thereby ensuring normal use of the array substrate 100.

In some embodiments, as shown in FIG. 1, a second opening 181 is formed in the third insulating layer 180, the second opening 181 extends through the third insulating layer 180 and the first insulating layer 160 in a thickness direction of the array substrate 100, the second opening 181 exposes the first electrode 151, the pixel electrode layer 190 includes a pixel electrode 191, and the pixel electrode 191 is electrically connected to the first electrode 151 through the second opening 181. The first electrode 151 is a part of the thin film transistor. By electrically connecting the pixel electrode 191 to the first electrode 151, the pixel electrode 191 may be electrically connected to the thin film transistor. In the process of using the array substrate 100, by controlling the turn-on and turn-off of the thin film transistor, the signal conduction on the pixel electrode 191 may be controlled, and the light-emitting mode of the light-emitting pixel may be controlled to satisfy different display requirements.

In other embodiments, as shown in FIG. 2, a third opening 182 is formed in the third insulating layer 180, and the third opening 182 exposes the second electrode 171. The pixel electrode layer 190 includes a pixel electrode 191, and the pixel electrode 191 is electrically connected to the second electrode 171 through the third opening 182. The second electrode 171 is a part of the thin film transistor. By electrically connecting the pixel electrode 191 to the second electrode 171, the pixel electrode 191 may be electrically connected to the thin film transistor. In the process of using the array substrate 100, by controlling the turn-on and turn-off of the thin film transistor, the signal conduction on the pixel electrode 191 may be controlled, and the light-emitting mode of the light-emitting pixel may be controlled to satisfy different display requirements.

It should be noted that during use of the array substrate 100, the pixel electrode 191 is electrically connected to the drain of the thin film transistor. When the pixel electrode 191 is electrically connected to the first electrode 151, the first electrode 151 is a drain, and when the pixel electrode 191 is electrically connected to the second electrode 171, the second electrode 171 is a drain.

Alternatively, the second electrode layer 170 further includes a common electrode 173. That is, when the second electrode layer 170 is formed and patterned, the second electrode 171 and the common electrode 173 may be formed at the same time, or the light shielding electrode 172 and the common electrode 173 may be formed at the same time, so that the photomask process for separately forming the common electrode 173 may be omitted, thereby simplifying the manufacturing process of the array substrate 100 and reducing the production cost.

The pixel electrode layer 190 further includes a connecting electrode 192, that is, when the pixel electrode layer 190 is formed and patterned, the pixel electrode 191 and the connecting electrode 192 may be formed at the same time, so that the photomask process for separately forming the connecting electrode 192 may be omitted, thereby simplifying the manufacturing process of the array substrate 100 and reducing the production cost.

The third insulating layer 180 is provided with a fourth opening 183 corresponding to the common electrode 173, and the connecting electrode 192 is electrically connected to the common electrode 173 through the fourth opening 183. In addition, a common electrode line (not shown) is provided in the array substrate 100, and the common electrode line may be provided in the same layer as the gate 121, that is, when the gate electrode layer 120 is formed and patterned, the gate 121 and the common electrode line may be formed at the same time, thereby simplifying the manufacturing process of the array substrate 100.

It should be noted that, the connecting electrode 192 is electrically connected to the common electrode line in addition to the common electrode 173. That is, during use of the array substrate 100, a corresponding control signal is inputted into the common electrode line, and the control signal is transmitted to the common electrode 173 via the connecting electrode 192, so that the light emitting mode of the corresponding light emitting pixel may be controlled to satisfy different display requirements.

Next, an embodiment of the present disclosure provides a display panel including an array substrate, and a specific structure of the array substrate refers to the foregoing embodiments. Since the present display panel adopts all the technical solutions of the above embodiments, the display panel has at least all beneficial effects brought by the technical solutions of the foregoing embodiments, which will not be repeated herein.

Figure 9:
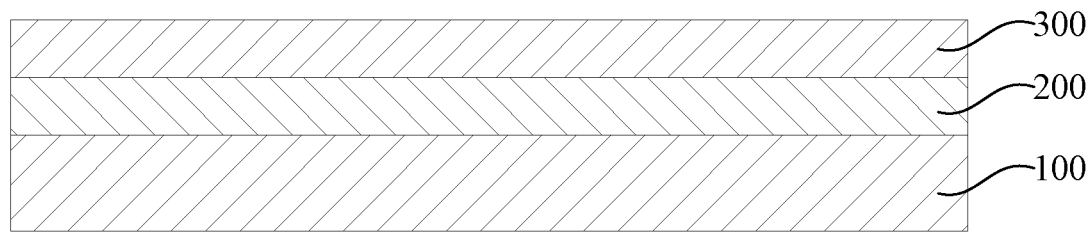
FIG. 9 is a schematic structural diagram of a display panel according to an embodiment of the present disclosure.

As shown in FIG. 9, the display panel 10 includes an array substrate 100, a light emitting device 200, and a package assembly 300. The light-emitting device 200 is disposed on the array substrate 100, and the array substrate 100 is electrically connected to the light-emitting device 200 to control the light-emitting mode of the light-emitting device 200, thereby controlling the overall display mode of the display panel 10. The package assembly 300 is provided on the light-emitting device 200 to protect the internal structures of the light-emitting device 200 and the array substrate 100, so as to prevent external moisture or oxygen from entering and corroding the internal structures of the light-emitting device 200 or the array substrate 100, thereby ensuring the overall performance and display effect of the display panel 10.

It should be noted that the display panel 10 in the embodiments of the present disclosure has a wide range of applications, including various display devices and lighting display devices such as a television, a computer, a mobile phone, a foldable display screen, and a curvable display screen, as well as wearable devices such as a smart bracelet and a smart watch, all of which are within the range of applications of the display panel 10 in the embodiments of the present disclosure.

Figure 4:
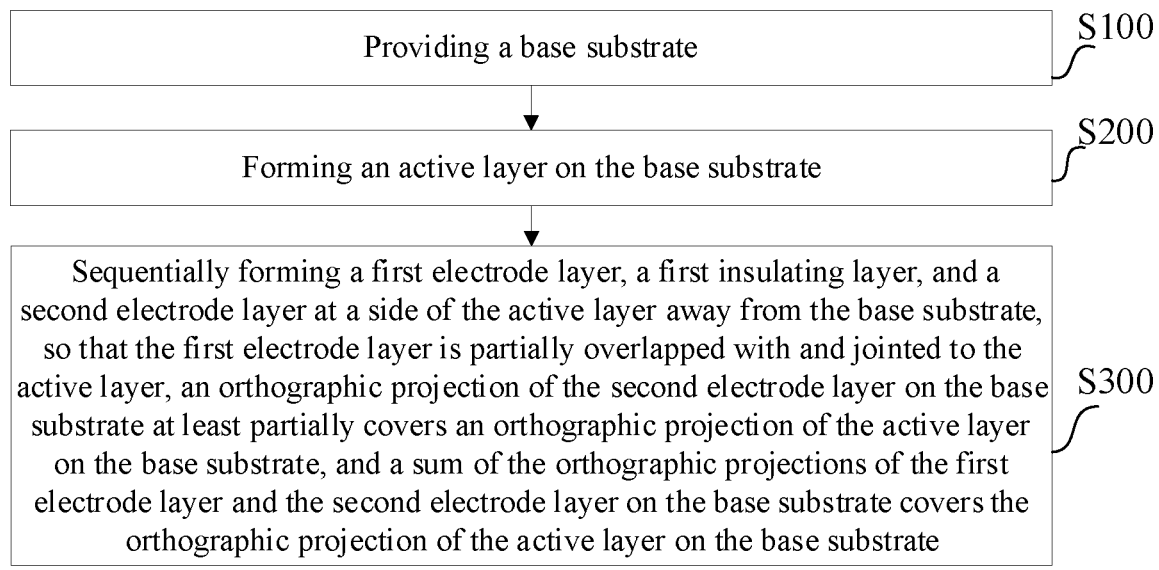
FIG. 4 is a flowchart of a method for manufacturing an array substrate according to an embodiment of the present disclosure.

Finally, an embodiment of the present disclosure further provides a method for manufacturing the array substrate. As shown in FIG. 4, the method for manufacturing the array substrate mainly includes the following steps.

At step S100, a base substrate 110 is provided.

When fabricating the array substrate 100, it is first necessary to provide a base substrate 110 and clean the base substrate 110 to remove stains on the base substrate 110 so as to facilitate the fabrication of subsequent film layers. The base substrate 110 is used as a support structure of the array substrate 100 for supporting other functional structure layers of the array substrate 100 to ensure structural stability of the array substrate 100. The base substrate 110 may be a glass substrate or a substrate including other materials, and is not particularly limited herein.

At step S200, an active layer 140 is formed on the base substrate 110.

After the base substrate 110 is prepared, an active layer 140 is deposited on the base substrate 110, and the active layer 140 is patterned. The active layer 140 is an important part of the thin film transistor in the array substrate 100, and is used to form a conductive channel. The on-state of the thin film transistor may be controlled by regulating the conductive channel in the active layer 140.

At S300, a first electrode layer 150, a first insulating layer 160, and a second electrode layer 170 are sequentially formed at a side of the active layer 140 away from the base substrate 110, so that the first electrode layer 150 is partially overlapped with and jointed to the active layer 140, an orthographic projection of the second electrode layer 170 on the base substrate 110 at least partially covers an orthographic projection of the active layer 140 on the base substrate 110, and the sum of the orthographic projections of the first electrode layer 150 and the second electrode layer 170 on the base substrate 110 covers the orthographic projection of the active layer 140 on the base substrate 110.

After the active layer 140 is formed, the first electrode layer 150, the first insulating layer 160, and the second electrode layer 170 are sequentially deposited at the side of the active layer 140 away from the base substrate 110, and the first electrode layer 150 and the second electrode layer 170 are respectively patterned, so that the first electrode layer 150 is partially overlapped with and jointed to the active layer 140, the orthographic projection of the second electrode layer 170 on the base substrate 110 at least partially covers the orthographic projection of the active layer 140 on the base substrate 110, and the sum of the orthographic projections of the first electrode layer 150 and the second electrode layer 170 on the base substrate 110 covers the orthographic projection of the active layer 140 on the base substrate 110.

Since the first electrode layer 150 is overlapped with and jointed to the active layer 140, transmission of an input signal on the array substrate 100 between the active layer 140 and the first electrode layer 150 may be realized, thereby realizing normal use of the array substrate 100. The first insulating layer 160 is used to separate the first electrode layer 150 from the second electrode layer 170, so as to avoid interference between the first electrode layer 150 and the second electrode layer 170 due to direct overlapping and jointing, and the further effect on normal use of the array substrate 100. The first insulating layer 160 includes a passivation layer 162 and a planarization layer 163 which are arranged in a stacked manner. The passivation layer 162 mainly plays the role of insulation. When the first electrode layer 150 is formed, the first electrode layer 150 needs to be patterned, and thus the surface flatness is poor after the formation of the passivation layer 162. By forming the planarization layer 163 on the passivation layer 162, it is conducive to improving the flatness of the overall surface, thereby contributing to the fabrication of subsequent film layers, and ensuring the overall structural stability of the array substrate 100.

It should be noted that the first electrode layer 150 partially covers the active layer 140 when the first electrode layer 150 is overlapped with and jointed to the active layer 140, so that by the joint action of the first electrode layer 150 and the second electrode layer 170, the orthographic projections of the first electrode layer 150 and the second electrode layer 170 on the base substrate 110 together cover the orthographic projections of the active layer 140 on the base substrate 110, the active layer 140 may be protected, and the external light is avoided from affecting the active layer 140, thereby ensuring stability of the array substrate 100.

Figure 5:
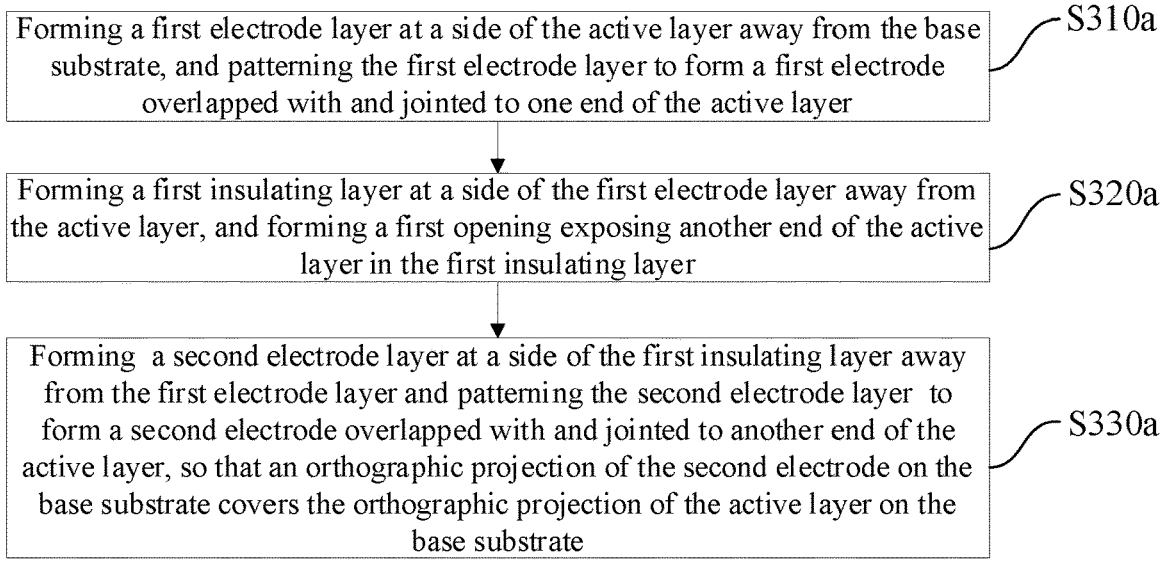
FIG. 5 is a flowchart of a step S300 shown in FIG. 4 according to an embodiment of the present disclosure.

In some embodiments, as shown in FIG. 5, the step S300 primarily includes the following steps.

At step S310a, a first electrode layer 150 is formed at a side of the active layer 140 away from the base substrate 110, and the first electrode layer 150 is patterned to form a first electrode 151 overlapped with and jointed to one end of the active layer 140.

At step S320a, a first insulating layer 160 is formed at a side of the first electrode layer 150 away from the active layer 140, and a first opening 161 exposing another end of the active layer 140 is formed in the first insulating layer 160.

At step S330a, a second electrode layer 170 is formed at a side of the first insulating layer 160 away from the first electrode layer 150, and the second electrode layer 170 is patterned to form a second electrode 171 overlapped with and jointed to another end of the active layer 140, so that an orthographic projection of the second electrode 171 on the base substrate 110 covers the orthographic projection of the active layer 140 on the base substrate 110.

Figure 6:
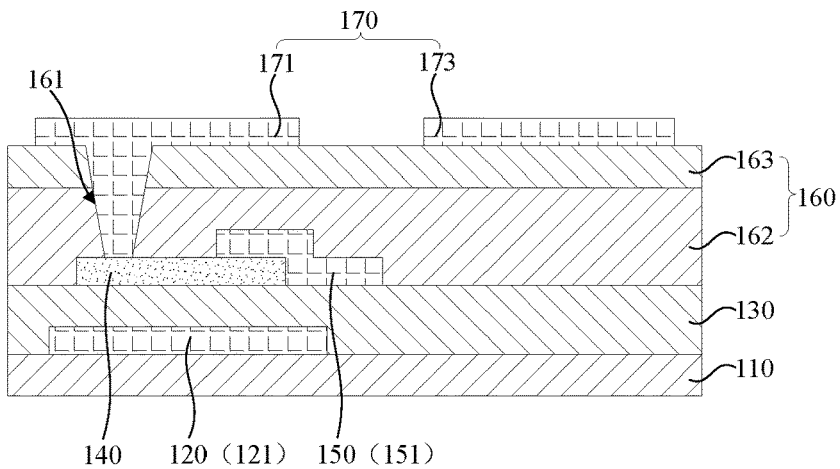
FIG. 6 is a schematic structural diagram of a step S330a shown in FIG. 5 according to an embodiment of the present disclosure.

As shown in FIG. 6, in the process of fabricating the array substrate 100, the first electrode 151 is formed by patterning the first electrode layer 150, and the second electrode 171 is formed by patterning the second electrode layer 170, so that the first electrode 151 and the second electrode 171 are parts of the thin film transistor, the first electrode 151 and the second electrode 171 are overlapped with and jointed to both ends of the active layer 140 respectively, and carriers flow between the first electrode 151 and the second electrode 171 through the conductive channel in the active layer 140, thereby achieving normal use of the array substrate 100. At the same time, the orthographic projection of the second electrode 171 on the base substrate 110 is provided so as to cover the orthographic projection of the active layer 140 on the base substrate 110, so that the second electrode 171 may also function as a light shielding effect on the active layer 140 to avoid the influence of the external light on the active layer 140, thereby ensuring the stability of the array substrate 100.

The first electrode 151 is a drain and the second electrode 171 is a source, or the first electrode 151 is the source and the second electrode 171 is the drain electrode. The definition of the source and drain may be adjusted according to actual design requirements, and is not particularly limited herein. The turn-on or turn-off of the thin film transistor may be controlled by controlling the conduction or disconnection between the source and the drain.

Figure 7:
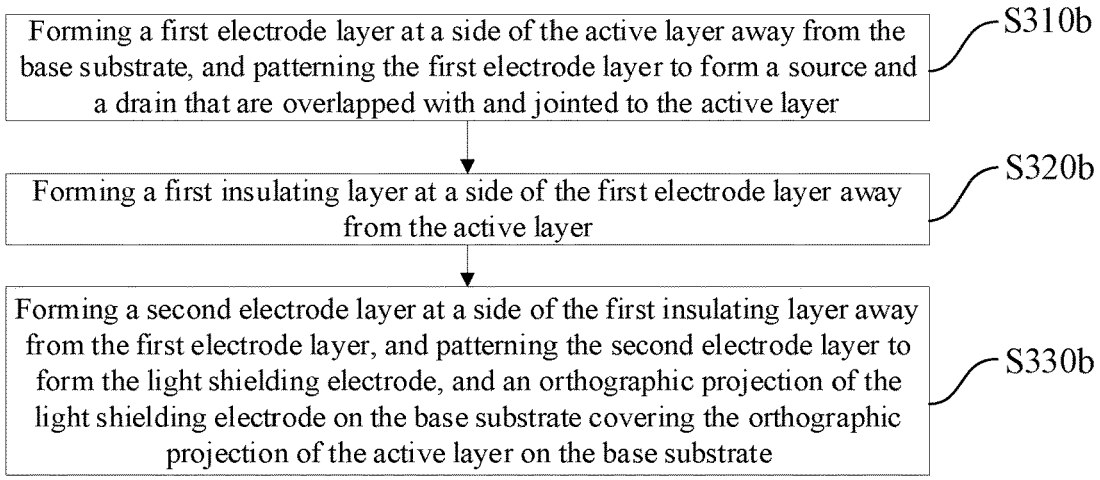
FIG. 7 is an another flowchart of a step S300 shown in FIG. 4 according to an embodiment of the present disclosure.

In other embodiments, as shown in FIG. 7, the step S300 mainly includes the following steps.

At step S310b, a first electrode layer 150 is formed at a side of the active layer 140 away from the base substrate 110, and the first electrode layer 150 is patterned to form a source 152 and a drain 153 that are overlapped with and jointed to the active layer 140.

At step S320b, a first insulating layer 160 is formed at a side of the first electrode layer 150 away from the active layer 140.

At step S330b, a second electrode layer 170 is formed at a side of the first insulating layer 160 away from the first electrode layer 150, and the second electrode layer 170 is patterned to form the light shielding electrode 172, and an orthographic projection of the light shielding electrode 172 on the base substrate 110 covers the orthographic projection of the active layer 140 on the base substrate 110.

Figure 8:
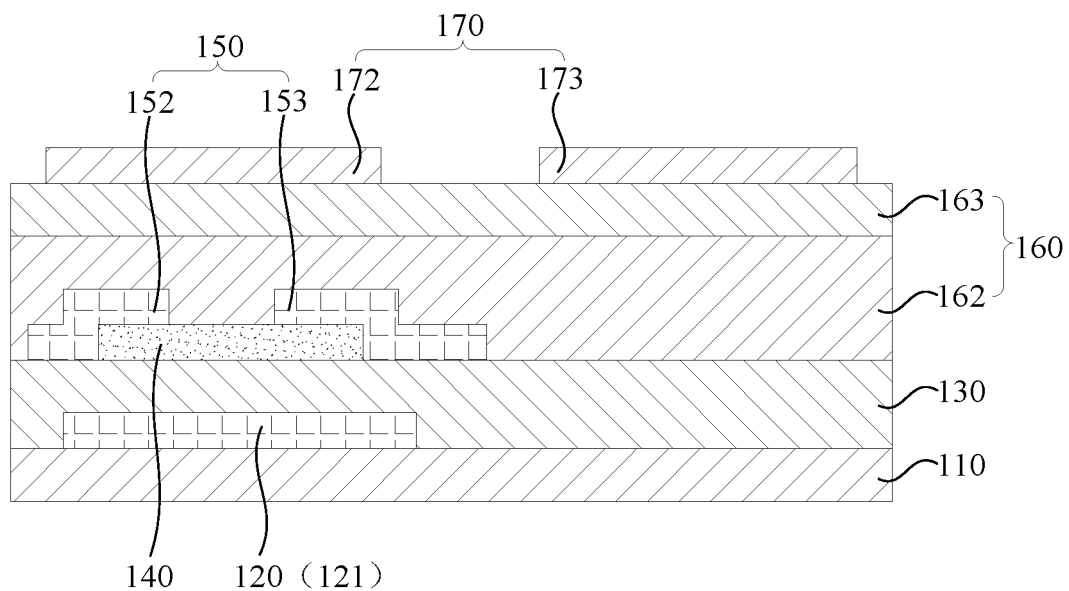
FIG. 8 is a schematic structural diagram of a step S330b shown in FIG. 7 according to an embodiment of the present disclosure.

As shown in FIG. 8, in the process of fabricating the array substrate 100, the first electrode layer 150 is patterned to form the source 152 and the drain 153 that are overlapped with and jointed to the active layer 140, and the second electrode layer 170 is patterned to form the light shielding electrode 172, so that the source 152 and the drain 153 of the thin film transistor are simultaneously formed in the first electrode layer 150, the second electrode layer 170 only serves as a light shielding function for a corresponding part of the active layer 140, so as to avoid the influence of the external light on the active layer 140, thereby ensuring the stability of the array substrate 100. This configuration makes the use of the thin film transistor independent of the light shielding electrode 172, so as to prevent the light shielding electrode 172 from interfering with the use of the thin film transistor, thereby ensuring stability during use of the array substrate 100.

Optionally, during the fabrication of the array substrate 100, a gate layer 120 and a second insulating layer 130 are sequentially deposited on the base substrate 110 before the active layer 140 is formed, and the gate layer 120 is patterned to form a gate 121 corresponding to the active layer 140, so that the orthographic projection of the gate 121 on the base substrate 110 covers the orthographic projection of the active layer 140 on the base substrate 110.

The orthographic projection of the gate 121 on the base substrate 110 covers the orthographic projection of the active layer 140 on the base substrate 110, so that the gate 121 may shield a side of the active layer 140 facing the base substrate 110 at the same time, thereby realizing the double-side light shielding of the active layer 140, further avoiding the influence of external light on the active layer 140, and ensuring the stability of the array substrate 100. The second insulating layer 130 is provided between the gate layer 120 and the active layer 140, and the second insulating layer 130 covers the gate layer 120 to separate the gate layer 120 from the active layer 140, so as to avoid interference between the gate layer 120 and the active layer 140, thereby ensuring normal operation of the thin film transistor.

Optionally, after the second electrode layer 170 is formed, the method for fabricating the array substrate 100 further includes depositing a third insulating layer 180 and a pixel electrode layer 190 in sequence at a side of the second electrode layer 170 away from the first insulating layer 160, forming a second opening 181 exposing the first electrode 151 in the third insulating layer 180, and patterning the pixel electrode layer 190 to form a pixel electrode 191 connected to the first electrode 151.

The third insulating layer 180 serves to separate the second electrode layer 170 from the pixel electrode layer 190 so as to avoid mutual interference between the pixel electrode layer 190 and the second electrode layer 170, thereby ensuring normal use of the array substrate 100. By electrically connecting the pixel electrode 191 to the first electrode 151, the pixel electrode 191 may be electrically connected to the thin film transistor. In the process of using the array substrate 100, by controlling the turn-on and turn-off of the thin film transistor, the signal conduction on the pixel electrode 191 may be controlled, and the light-emitting mode of the light-emitting pixel may be controlled to satisfy different display requirements.

It should be noted that, when the second electrode layer 170 is patterned, the second electrode 171 and the common electrode 173 may be formed at the same time, or the light shielding electrode 172 and the common electrode 173 may be formed at the same time. Therefore, the photomask process for separately forming the common electrode 173 may be omitted, thereby simplifying the manufacturing process of the array substrate 100 and reducing the production cost.

The above is a detailed description of an array substrate, a display panel, and a method for manufacturing the array substrate according to an embodiment of the present disclosure. The principles and embodiments of the present disclosure have been described with reference to specific embodiments, and the description of the above embodiments is merely intended to aid in the understanding of the method of the present disclosure and its core idea. At the same time, changes may be made by those skilled in the art to both the specific implementations and the scope of application in accordance with the teachings of the present disclosure. In view of the foregoing, the content of the present specification should not be construed as limiting the disclosure.

What is claimed is:

1. An array substrate, comprising:
   a base substrate;
   an active layer disposed above the base substrate;
   a first electrode layer disposed at a side of the active layer away from the base substrate, the first electrode layer being partially overlapped with and jointed to the active layer;
   a first insulating layer disposed at a side of the first electrode layer away from the active layer; and
   a second electrode layer disposed at a side of the first insulating layer away from the first electrode layer, an orthographic projection of the second electrode layer on the base substrate at least partially covering an orthographic projection of the active layer on the base substrate, and a sum of an orthographic projection of the first electrode layer on the base substrate and the orthographic projection of the second electrode layer on the base substrate covering the orthographic projection of the active layer on the base substrate, and wherein a sum of an area of a light shielding region of the second electrode layer to the active layer and an area of a light shielding region of the first electrode layer to the active layer is equal to an area of the orthographic projection of the active layer on the base substrate.

2. The array substrate according to claim 1, wherein the orthographic projection of the second electrode layer on the base substrate covers the orthographic projection of the active layer on the base substrate.

3. The array substrate according to claim 1, wherein the first electrode layer comprises a first electrode, and the first electrode is overlapped with and jointed to one end of the active layer; the first insulating layer is provided with a first opening, and the first opening exposes another end of the active layer; and the second electrode layer comprises a second electrode, and the second electrode is overlapped with and jointed to the another end of the active layer through the first opening.

4. The array substrate according to claim 3, wherein the first electrode is a drain, and the second electrode is a source.

5. The array substrate according to claim 3, wherein the first electrode is a source, and the second electrode is a drain.

6. The array substrate according to claim 1, wherein the array substrate further comprises:
   a gate layer disposed between the base substrate and the active layer, the gate layer comprising a gate disposed corresponding to the active layer, an orthographic projection of the gate on the base substrate covering the orthographic projection of the active layer on the base substrate; and a second insulating layer disposed between the gate layer and the active layer, and covering the gate layer.

7. The array substrate according to claim 3, wherein the array substrate further comprises:
a third insulating layer disposed at a side of the second electrode layer away from the first insulating layer, the third insulating layer being provided with a second opening, the second opening penetrating through the third insulating layer and the first insulating layer in a thickness direction of the array substrate, and the second opening exposing the first electrode; and
a pixel electrode layer disposed at a side of the third insulating layer away from the second electrode layer, the pixel electrode layer comprising a pixel electrode, and the pixel electrode being electrically connected to the first electrode through the second opening.

8. The array substrate according to claim 7, wherein the second electrode layer further comprises a common electrode, the pixel electrode layer further comprises a connecting electrode, the third insulating layer is provided with a fourth opening at a position corresponding to the common electrode, and the connecting electrode is electrically connected to the common electrode through the fourth opening.

9. The array substrate according to claim 1, wherein a material of the second electrode layer is an opaque conductive material.

10. A display panel, comprising the array substrate according to claim 1.

11. An array substrate, comprising:
a base substrate;
an active layer disposed above the base substrate;
a first electrode layer disposed at a side of the active layer away from the base substrate, the first electrode layer being partially overlapped with and jointed to the active layer;
a first insulating layer disposed at a side of the first electrode layer away from the active layer; and
a second electrode layer disposed at a side of the first insulating layer away from the first electrode layer, an orthographic projection of the second electrode layer on the base substrate covering an orthographic projection of the active layer on the base substrate,
wherein the first electrode layer comprises a first electrode, and the first electrode is overlapped with and jointed to one end of the active layer; the first insulating layer is provided with a first opening, and the first opening exposes another end of the active layer; and the second electrode layer comprises a second electrode, and the second electrode is overlapped with and jointed to the another end of the active layer through the first opening, and wherein a sum of an area of a light shielding region of the second electrode layer to the active layer and an area of a light shielding region of the first electrode layer to the active layer is equal to an area of the orthographic projection of the active layer on the base substrate.

12. The array substrate according to claim 11, wherein the first electrode is a drain and the second electrode is a source.

13. The array substrate according to claim 11, wherein the first electrode is a source and the second electrode is a drain.

14. The array substrate according to claim 11, wherein the array substrate further comprises:
a gate layer disposed between the base substrate and the active layer, the gate layer comprising a gate disposed corresponding to the active layer, and an orthographic projection of the gate on the base substrate covering the orthographic projection of the active layer on the base substrate; and
a second insulating layer disposed between the gate layer and the active layer, and covering the gate layer.

15. The array substrate according to claim 11, wherein the array substrate further comprises:
a third insulating layer disposed at a side of the second electrode layer away from the first insulating layer, the third insulating layer being provided with a second opening, the second opening penetrating through the third insulating layer and the first insulating layer in a thickness direction of the array substrate, and the second opening exposing the first electrode; and
a pixel electrode layer disposed at a side of the third insulating layer away from the second electrode layer, the pixel electrode layer comprising a pixel electrode, and the pixel electrode being electrically connected to the first electrode through the second opening.

16. An array substrate, comprising:
a base substrate;
an active layer disposed above the base substrate;
a first electrode layer disposed at a side of the active layer away from the base substrate, the first electrode layer being partially overlapped with and jointed to the active layer;
a first insulating layer disposed at a side of the first electrode layer away from the active layer; and
a second electrode layer disposed at a side of the first insulating layer away from the first electrode layer, an orthographic projection of the second electrode layer on the base substrate at least partially covering an orthographic projection of the active layer on the base substrate, and a sum of an orthographic projection of the first electrode layer on the base substrate and the orthographic projection of the second electrode layer on the base substrate covering the orthographic projection of the active layer on the base substrate, the first electrode layer comprises a first electrode, and the first electrode is overlapped with and jointed to one end of the active layer; the first insulating layer is provided with a first opening, and the first opening exposes another end of the active layer; and the second electrode layer comprises a second electrode, and the second electrode is overlapped with and jointed to the another end of the active layer through the first opening,
the array substrate further comprises:
a third insulating layer disposed at a side of the second electrode layer away from the first insulating layer, the third insulating layer being provided with a second opening, the second opening penetrating through the third insulating layer and the first insulating layer in a thickness direction of the array substrate, and the second opening exposing the first electrode; and
a pixel electrode layer disposed at a side of the third insulating layer away from the second electrode layer, the pixel electrode layer comprising a pixel electrode, and the pixel electrode being electrically connected to the first electrode through the second opening; and
wherein the second electrode layer further comprises a common electrode, the pixel electrode layer further comprises a connecting electrode, the third insulating layer is provided with a fourth opening at a position corresponding to the common electrode, and the connecting electrode is electrically connected to the common electrode through the fourth opening.

\* \* \* \* \*